United States Patent [19]
Lo et al.

[11] Patent Number: 5,804,091
[45] Date of Patent: Sep. 8, 1998

[54] METHOD OF PREVENTING DEFECTS AND PARTICLES PRODUCED AFTER TUNGSTEN ETCH BACK

[75] Inventors: Yung Tsun Lo, Yi Lan Hsien; Guan Jiun Yi, Chu Tung Chen; Chi Hen Lin, Taipei; Jyh Ming Jih, Ta Chia Chen Taichung Hsien, all of Taiwan

[73] Assignee: Mosel Vitelic Inc., Hsinchu, Taiwan

[21] Appl. No.: 683,248

[22] Filed: Jul. 18, 1996

[51] Int. Cl.$^6$ .................... H01L 21/205; H01L 21/318
[52] U.S. Cl. ................ 216/100; 438/629; 438/672; 438/685
[58] Field of Search ............... 156/636.1; 134/1; 216/100; 438/629, 672, 685

[56] References Cited

U.S. PATENT DOCUMENTS

| | | | |
|---|---|---|---|
| 4,931,411 | 6/1990 | Tigalaar et al. | 437/192 |
| 5,612,254 | 3/1997 | Mu et al. | 437/195 |
| 5,656,097 | 8/1997 | Olesen et al. | 134/1 |

OTHER PUBLICATIONS

*Particles on Surfaces Detection, Adhesion and Removal* Ed., Mittal 1995 pp. 111–139.

*Primary Examiner*—John Goodrow

[57] ABSTRACT

The present invention is a method of preventing defects and particles produced after tungsten etch back. The method utilizes the Ar plasma process, baking process, and D.I. water flushing with megasonic shacking to reduce a lot of defects and particles on the surface of a wafer. Thus, the present invention can prevent defects and particles produced after tungsten etch back.

13 Claims, 2 Drawing Sheets

METHOD OF PREVENTING DEFECTS AND PARTICLES PRODUCED AFTER TUNGSTEN ETCH BACK

FIELD OF THE INVENTION

The present invention relates to process technology after tungsten etch back and, more particularly, to a method of preventing defects and particles produced after tungsten etch back.

BACKGROUND OF THE INVENTION

In conventional processes, the method of making tungsten plug includes two steps: first, depositing tungsten layer on a TiN layer, then second, etching back the said tungsten layer and remaining tungsten plug on the wafer. Generally, before the step of depositing tungsten by chemical vapor deposition method, it is required to forming a TiN layer as the tungsten adhesive layer first. The reason is to help tungsten deposit on the wafer stable. Moreover, the top of TIN layer serves as the stop point of the tungsten etch back step. Thus the TiN layer will be exposed after the step of tungsten etch back finished. After the step of tungsten etch back two hours to two days, there are a lot of particles such as $TiF_x$, and $Ti(H_2O)_6F_3$ scattered on the surface of the untreated wafer. Once these undesired particles generated there is no way to get ride of the particles even though to etch back the wafer again or scrubbing the surface of the wafer. The other serious problem is that the exposed TiN layer is attacked by plasma during the step of tungsten etch back. This made the surface of TN layer damaged. Thus, there are amount of defects and particles generated on the damaged surface of TiN layer after the sequence step of scrubbing as shown in FIG. 1. The number of the defects and particles is around over ten thousand. Above-mentioned said problems cause that the yield is lower and the contamination is generated.

SUMMARY OF THE INVENTION

In accordance with the present invention, a method of preventing defects and particles produced after tungsten etch back is disclosed. In one embodiment of this method, the first conductive layer is formed by tungsten chemical vapor deposit on the titanium nitride( TiN )layer, and then said first conductive layer is removed using tungsten etch back until said titanium nitride( TiN )layer is exposed. Next, to remove the residues on the surface of said titanium nitride( TiN )layer is done by Ar plasma process. The wafer is baked with the baking time about 1–20 min. and the baking temperature about 100°–200° C., wherein said wafer has been formed said titanium nitride ( TiN )layer on. Finally, the residues on the surface of said titanium nitride( TiN )layer are removed again by D.I. water flush with megasonic shaking; and the second conductive layer is formed by sputter process on said titanium nitride( TiN )layer.

DETAILED DESCRIPTION OF THE PREFERRED EMBODIMENTS

Figure 1:
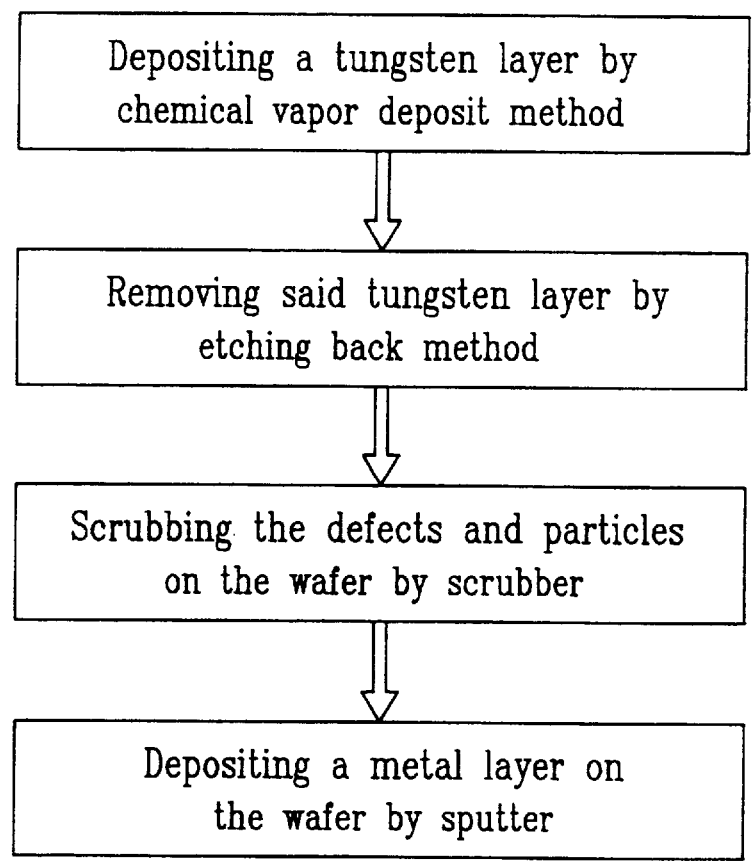
FIG. 1 is a process flow chart of the conventional method.
Figure 2:
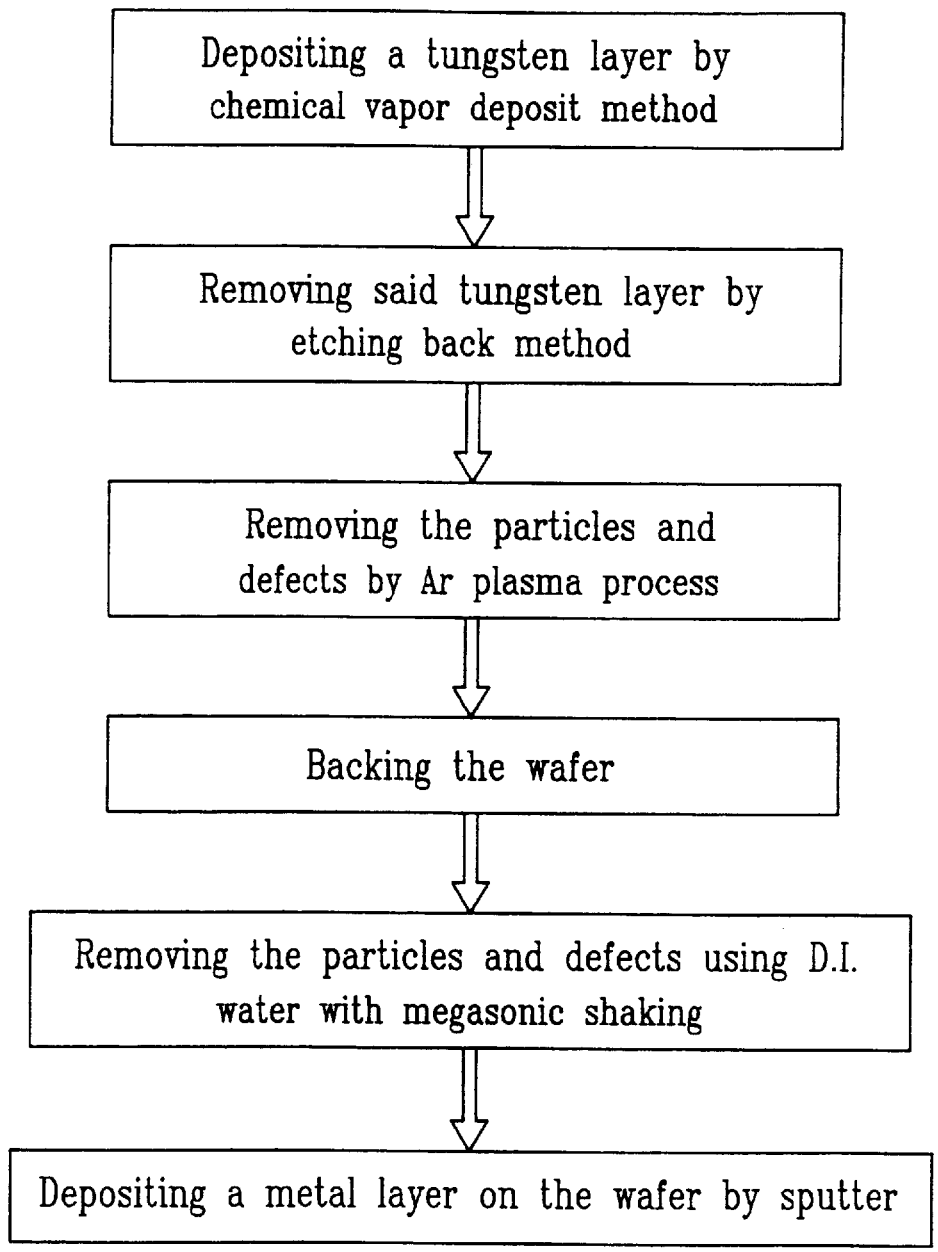
FIG. 2 is a process flow chart of this invention method.

After a long time research, we discover this method that can solve effectively the said serious problems at the same time. The advantage of this invention is that it can avoid growing particles and scrubbing particles and defects after tungsten etch back. This method of invention is applied to the production line. The main steps of this invention are shown in FIG. 2.

The first step is forming the first conductive layer on the titanium nitride( TiN ) layer. The first conductive layer is deposited tungsten layer on the titanium nitride ( TiN ) layer by chemical vapor deposit method. This is also called tungsten-CVD. After tungsten-CVD step, it is going to the step of removing said first conductive layer until said titanium nitride( TiN )layer is exposed. This step is done by plasma etch back process and the said titanium nitride( TiN )layer is the stop point of plasma etch back process. As usual, this step is called tungsten etch back. The two steps as above described are the same as the conventional method. After the two steps, adding a new step is removing the residues on the surface of said titanium nitride( TiN )layer. The step of removing the residues is done by Ar plasma process. The Ar plasma process is utilized Ar ion vapor flushing to get rid of the intermediate gas of particles on the surface of wafer. The compositions of said particles includeTiF$_x$, Ti(H$_2$O)$_6$F$_3$, or both. The next process is baking the wafer which has been formed said titanium nitride( TiN )layer on. The wafer is placing on the hot plate with the temperature rang about 100°–200° C. to bake around 1–20 min. There are two purposes of this baking step. The first purpose is to strengthen and harden the damaged surface of said titanium nitride( TiN )layer after tungsten etch back to prevent scrubbing a lot of defects and particles. The second purpose is to utilize heat to evaporate the remaining intermediate gas of particles. When baking is over, the wafer is continue to be scrubed the residues of the surface of said titanium nitride( TiN )layer again. In this step, using D.I. water flushing with megasonic shaking to clean the wafer surface instead of using the traditional method with scrubber to scrub the wafer surface. The advantage of this way is to avoid to damage the surface of wafer when the scrubber touches the surface of the wafer. In addition, D.I. water can solve some remained hydrophilic particles and the intermediate gas of particles after tungsten etch back. Finally, the second conductive layer is formed by sputter on said titanium nitride( TiN )layer. The second conductive layer is a metal layer.

The method of invention has been verified that it is effective to solve the problem of prior art after we research and test. This method can reduce ten thousand of particles and defects to below ten particles and defects produced after tungsten etch back process and solve the problem of yield in production line.

Although specific embodiment has been illustrated and described, it will be obvious to those skilled in the art that various modifications may be made without departing from the which is intended to be limited solely by the appended claims.

We claim:

1. A method of preventing defects and particles produced after tungsten etch back in a wafer, the method comprising:

forming a first conductive layer on a titanium nitride (TiN) layer, wherein said titanium nitride (TiN) layer is formed on the substrate of a wafer;

removing said first conductive layer until said titanium nitride (TiN) layer is exposed, thereby some residues are produced on the surface of said titanium nitride (TiN) layer, wherein said residues include defects and particles;

removing the residues on the surface of said titanium nitride (TiN) layer by using a plasma etch;

baking the wafer;

secondly removing the residues on the surface of said titanium nitride (TiN) layer again by using megasonic shaking in deionized water; and forming a second conductive layer on said titanium nitride (TiN) layer.

2. The method according to claim 1, wherein forming the first conductive layer comprises depositing conductive metal using a chemical vapor deposit method.

3. The method according to claim 1, wherein said first conductive layer comprises a metal layer.

4. The method according to claim 3, wherein said metal layer comprises tungsten.

5. The method according to claim 1, wherein removing said first conductive layer comprises etching said conductive layer using a plasma etch back method.

6. The method according to claim 5, wherein said titanium nitride (TiN) layer acts as a stop point of said plasma etch back method.

7. The method according to claim 1, wherein said plasma etching process comprises using Ar ion vapor as a source of plasma.

8. The method according to claim 1, wherein the step of baking the wafer is done using a baking process with a temperature range of about 100°–200° C.

9. The method according to claim 1, wherein the step of baking the wafer is done using a baking process in a time range of about 1–20 min.

10. The method according to claim 1, wherein forming the second conductive layer comprises sputtering conductive material using sputter method of a physical vapor deposit.

11. The method according to claim 1, wherein said second conductive layer comprises a metal layer.

12. A method of preventing defects and particles produced after tungsten etch back in a wafer, the method comprising the steps of:

depositing, by a chemical vapor deposition process, a first metal layer comprising tungsten atop a titanium nitride (TiN) layer;

etching back the tungsten until a TiN surface is exposed, a residue comprising defects and particles remaining on said exposed TiN surface;

argon plasma etching the TiN surface to clean at least a portion of said residue;

baking the wafer for between 1–20 minutes at a temperature between 100°–200° C.;

flushing the resultant wafer with deionized water with megasonic shaking to clean the wafer surface; and sputtering a second metal layer on said TiN layer.

13. A method of preventing defects and particles produced after tungsten etch back in a wafer, the method comprising the steps of:

depositing, by a chemical vapor deposition process, a first metal layer comprising tungsten atop a titanium nitride (TiN) layer;

etching back the tungsten until a TiN surface is exposed, a residue comprising defects and particles remaining on said exposed TiN surface;

flushing the TiN surface with an argon ion vapor in a plasma process to thereby clean at least a portion of said residue;

baking the wafer for between 1–20 minutes at a temperature between 100°–200° C.;

flushing the resultant wafer with deionized water with megasonic shaking to clean the wafer surface; and sputtering a second metal layer on said TiN layer.

* * * * *